(12) United States Patent
Lo

(10) Patent No.: US 7,681,590 B2
(45) Date of Patent: Mar. 23, 2010

(54) PROCESS APPARATUS AND TRANSPORTATION SYSTEM THEREOF

(75) Inventor: Nai-Ying Lo, Kaohsiung (TW)

(73) Assignee: United Microelectronics Corp., Hsinchu (TW)

( * ) Notice: Subject to any disclaimer, the term of this patent is extended or adjusted under 35 U.S.C. 154(b) by 468 days.

(21) Appl. No.: 11/563,533

(22) Filed: Nov. 27, 2006

(65) Prior Publication Data

US 2007/0144607 A1    Jun. 28, 2007

Related U.S. Application Data

(60) Provisional application No. 60/748,772, filed on Dec. 8, 2005.

(51) Int. Cl.
*B67C 3/02* (2006.01)
(52) U.S. Cl. ........................ 137/613; 137/240
(58) Field of Classification Search ................ 137/240, 137/565.01, 613; 251/304, 305
See application file for complete search history.

(56) References Cited

U.S. PATENT DOCUMENTS 4,527,771 A * 7/1985 Yeary ........................ 251/118
6,412,518 B1 * 7/2002 Pieri ...................... 137/614.01

FOREIGN PATENT DOCUMENTS

| TW | 389380 | 5/2000 |
|---|---|---|
| TW | 524964 | 3/2003 |

* cited by examiner

*Primary Examiner*—Kevin L Lee
(74) *Attorney, Agent, or Firm*—Chun-Ming Shih

(57) ABSTRACT

A process apparatus including a chamber, a pump, and a transportation system set between the chamber and the pump is provided. The transportation system has a pipe, a pressure control valve, and a shielding unit. The pipe has an input end connected to the chamber and an output end connected to the pump to pump fluids out of the chamber through the pipe. The pressure control valve between the input and output ends is disposed on the pipe and has a valve plate to adjust a fluid flow in the pipe. The shielding unit between the input end and the pressure control valve is disposed on the pipe and has a shielding plate to be switched between an original position and a shielding position. The shielding plate at the shielding position permits conveyance of fluids in the pipe and prevents certain liquid particles of the fluids floating in the pipe.

19 Claims, 3 Drawing Sheets

PROCESS APPARATUS AND TRANSPORTATION SYSTEM THEREOF

CROSS-REFERENCE TO RELATED APPLICATION

This application claims the priority benefit of U.S. provisional application Ser. No. 60/748,772, filed on Dec. 8, 2005, all disclosures are incorporated therewith.

BACKGROUND OF THE INVENTION

1. Field of the Invention

The present invention relates to a semiconductor process apparatus, and more particularly, to a semiconductor process apparatus, a transportation system thereof, and a method of protecting a pressure control valve of the transportation system.

2. Description of Related Art

Vacuum systems have been extensively applied to semiconductor process apparatuses. The vacuum systems are required to operate the expensive apparatuses under an adequate pressure. Here, the apparatuses include the mainstream process apparatuses such as thin film deposition apparatuses, dry etching apparatuses, ion implantation apparatuses, lithography apparatuses, and the semiconductor surface analyzers such as scanning electron microscopes and secondary ion mass spectroscopes.

As is stated above, the pressure is one of the important manufacturing parameters set in many semiconductor process apparatuses. To ensure a smooth operation and reaction in a chamber of the semiconductor process apparatus, the pressure therein is often adjusted to a proper level by a pump and a pressure control valve in the semiconductor process apparatus.

FIG. 1 is a schematic view of a conventional process apparatus. Referring to FIG. 1, the conventional process apparatus 100 includes a chamber 110, a pump 120, and a transportation system 130. The transportation system 130 is disposed between the chamber 110 and the pump 120, and a fluid supply apparatus 140 is connected to the chamber 110. The transportation system 130 includes a pipe 132 and a pressure control valve 134. The pipe 132 has an input end 132a connected to the chamber 110 and an output end 132b connected to the pump 120. The pressure control valve 134 is disposed on the pipe 132.

In addition, the pump 120 is adapted to pump fluids (gas, liquid . . . etc) out of the chamber 110 through the pipe 132, and to adjust the pressure in the chamber 110 to a proper level with use of the pressure control valve 134. Besides, the pressure control valve 134 is, for example, a butterfly valve comprising a valve plate 134a used to adjust a fluid flow in the pipe 132. Specifically, the pressure control valve 134 can rotate the valve plate 134a along a pivot shaft (not shown) to a proper angle, and an open degree of the valve plate 134a varies in accordance with the rotation of the valve plate 134a. Thus, the fluid flow increases when the open degree of the valve plate 134a is raised and decreases when said open degree is lowered.

To meet the requirements of certain manufacturing processes, the process apparatus 100 further comprises a liquid supply apparatus 140 connected to the chamber 110 for supplying reactive liquids e.g. TESO, 4MS, TMCTS, TMDSO, DMDMOS, OMCTS, DEMS, or TVTMCTS to the chamber 110, so that the reactive liquids can react therein. Since the reactive liquids are aerosols, certain liquid particles 50 which have not been dissociated yet float into the pipe 132 during the reaction process. The liquid particles 50 which have not been dissociated yet then adhere to a surface of the valve plate 134a and solidify.

Excessive liquid particles 50 adhering to the valve plate 134a either give rise to unsmooth rotation of the valve plate 134a or prevent the valve plate 134a from being completely closed, so that conveyance of the fluids in the pipe 132 cannot be hindered. Thereby, the pressure within the chamber 110 cannot be adjusted with ease, further influencing the reaction in the chamber 110. In addition, given that the valve plate 134a cannot rotate smoothly or be completely closed, the maintenance cycle of the process apparatus 100 may be shortened, raising the maintenance costs.

SUMMARY OF THE INVENTION

Accordingly, an object of the present invention is to provide a process apparatus to reduce the probability of adhesion of liquid particles to a valve plate.

Another object of the present invention is to provide a transportation system to reduce the probability of adhesion of liquid particles to a valve plate.

Still another object of the present invention is to provide a method of protecting a pressure control valve to reduce the probability of adhesion of liquid particles to a valve plate.

To achieve the aforementioned or other objects, the present invention provides a process apparatus which comprises a chamber, a pump, and a transportation system. The transportation system is set between the chamber and the pump. In addition, the transportation system includes a pipe, a pressure control valve, and a shielding unit. The pipe has an input end connected to the chamber and an output end connected to the pump. The pump is adapted to pump fluids out of the chamber through the pipe. The pressure control valve is disposed on the pipe and is positioned between the input end and the output end. The pressure control valve comprises a valve plate adapted to adjust a fluid flow in the pipe. The shielding unit is disposed on the pipe and is positioned between the input end and the pressure control valve, wherein the shielding unit comprises a shielding plate adapted to be switched between an original position and a shielding position. When the shielding plate is located at the shielding position, the shielding plate permits conveyance of the fluids in the pipe and prevents certain liquid particles of the fluids floating in the pipe.

According to one embodiment of the present invention, the process apparatus further comprises a fluid supply apparatus connected to the chamber so as to supply the fluids thereto.

According to one embodiment of the present invention, a projection created by the shielding plate on the valve plate along the central line of the pipe substantially covers the whole valve plate when the shielding plate is located at the shielding position.

According to one embodiment of the present invention, a distance between the shielding plate and the valve plate is less than 50 cm when the shielding plate is located at the shielding position.

According to one embodiment of the present invention, said pressure control valve is a butterfly valve.

According to one embodiment of the present invention, said pressure control valve is a butterfly valve which comprises a pivot shaft connected to the valve plate. A projection created by the shielding plate on the pivot shaft along the central line of the pipe substantially covers the whole pivot shaft when the shielding plate is located at the shielding position.

According to one embodiment of the present invention, said pressure control valve is a pendulum valve.

According to one embodiment of the present invention, an open degree of the valve plate when the shielding plate is located at the shielding position is greater than that of the valve plate when the shielding plate is located at the original position.

According to one embodiment of the present invention, the transportation system further comprises a cleaning unit disposed on the pipe and adapted to spray a cleaning solution to the valve plate in the pipe.

To achieve the aforementioned or other objects, the present invention further provides a transportation system adapted to be set between a chamber and a pump. The transportation system comprises a pipe, a pressure control valve, and a shielding unit. The pipe includes an input end and an output end, wherein the input end is adapted to connect the chamber, the output end is adapted to connect the pump, and the pump is adapted to pump fluids out of the chamber through the pipe. The pressure control valve is disposed on the pipe and is positioned between the input end and the output end. The pressure control valve comprises a valve plate adapted to adjust a fluid flow in the pipe. The shielding unit is disposed on the pipe and is positioned between the input end and the pressure control valve, wherein the shielding unit comprises a shielding plate adapted to be switched between an original position and a shielding position. When the shielding plate is located at the shielding position, the shielding plate permits conveyance of the fluids in the pipe and prevents certain liquid particles of the fluids floating in the pipe.

According to one embodiment of the present invention, a projection created by the shielding plate on the valve plate along the central line of the pipe substantially covers the whole valve plate when the shielding plate is located at the shielding position.

According to one embodiment of the present invention, a distance between the shielding plate and the valve plate is less than 50 cm when the shielding plate is located at the shielding position.

According to one embodiment of the present invention, said pressure control valve is a butterfly valve.

According to one embodiment of the present invention, said pressure control valve is a butterfly valve which comprises a pivot shaft connected to the valve plate. A projection created by the shielding plate on the pivot shaft along the central line of the pipe substantially covers the whole pivot shaft when the shielding plate is located at the shielding position.

According to one embodiment of the present invention, said pressure control valve is a pendulum valve.

According to one embodiment of the present invention, an open degree of the valve plate when the shielding plate is located at the shielding position is greater than that of the valve plate when the shielding plate is located at the original position.

According to one embodiment of the present invention, the transportation system further comprises a cleaning unit disposed on the pipe and adapted to spray a cleaning solution to the valve plate in the pipe.

To achieve the aforementioned or other objects, the present invention further provides a method of protecting the pressure control valve which is applied to said process apparatus. The method comprises the following steps: switching the shielding plate from the original position to the shielding position when a reaction is performed in the chamber; and switching the shielding plate from the shielding position to the original position after the reaction is performed in the chamber.

According to one embodiment of the present invention, the method of protecting the pressure control valve further comprises the step of raising an open degree of the valve plate when the shielding plate is switched to the shielding position.

According to one embodiment of the present invention, the method of protecting the pressure control valve further comprises the step of lowering the open degree of the valve plate when the shielding plate is switched to the original position.

In the present invention, during the reaction in the chamber, the shielding plate is switched to the shielding position. Hence, certain liquid particles of the fluids floating in the pipe can be shielded, so as to reduce the probability of adhesion of the liquid particles to the valve plate. In consequence, the present invention is capable of improving the conventional valve plate by resolving the problems in that the valve plate cannot rotate smoothly or be completely closed due to adhesion of the liquid particles.

In order to the make aforementioned and other objects, features and advantages of the present invention comprehensible, preferred embodiments accompanied with figures are described in detail below.

DESCRIPTION OF EMBODIMENTS

In view of the foregoing, the conventional valve plate encounters the problems in that the valve plate cannot rotate smoothly or be completely closed due to adhesion of the liquid particles. Thus, the pressure within the chamber cannot be adjusted with ease, and the reaction in the chamber is then influenced. The spirit of the present invention is mainly to add a shielding unit disposed on the pipe to the process apparatus. During the reaction in the chamber, a shielding plate of the shielding unit is switched to a shielding position so as to prevent liquid particles of the fluids floating in the pipe, further reducing the probability of adhesion of the liquid particles to the valve plate. The following are embodiments of the process apparatus provided in the present invention. The present invention, however, is not limited thereto. One of ordinary skill in the art may modify the embodiment of the present invention without departing from the scope of the invention. Those modifications still fall within the scope of the invention.

Figure 1:
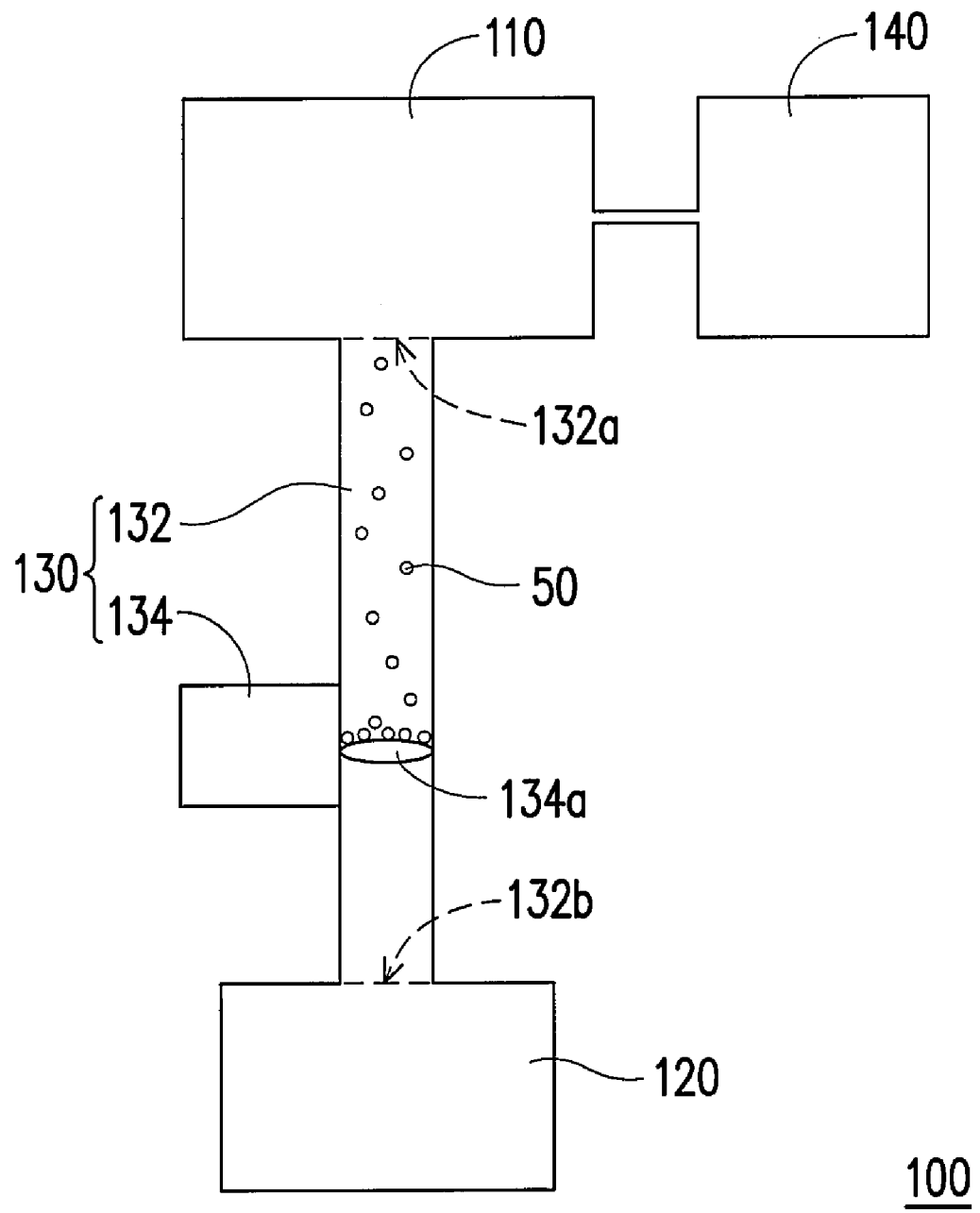
FIG. 1 is a schematic view of a conventional process apparatus.
Figure 2:
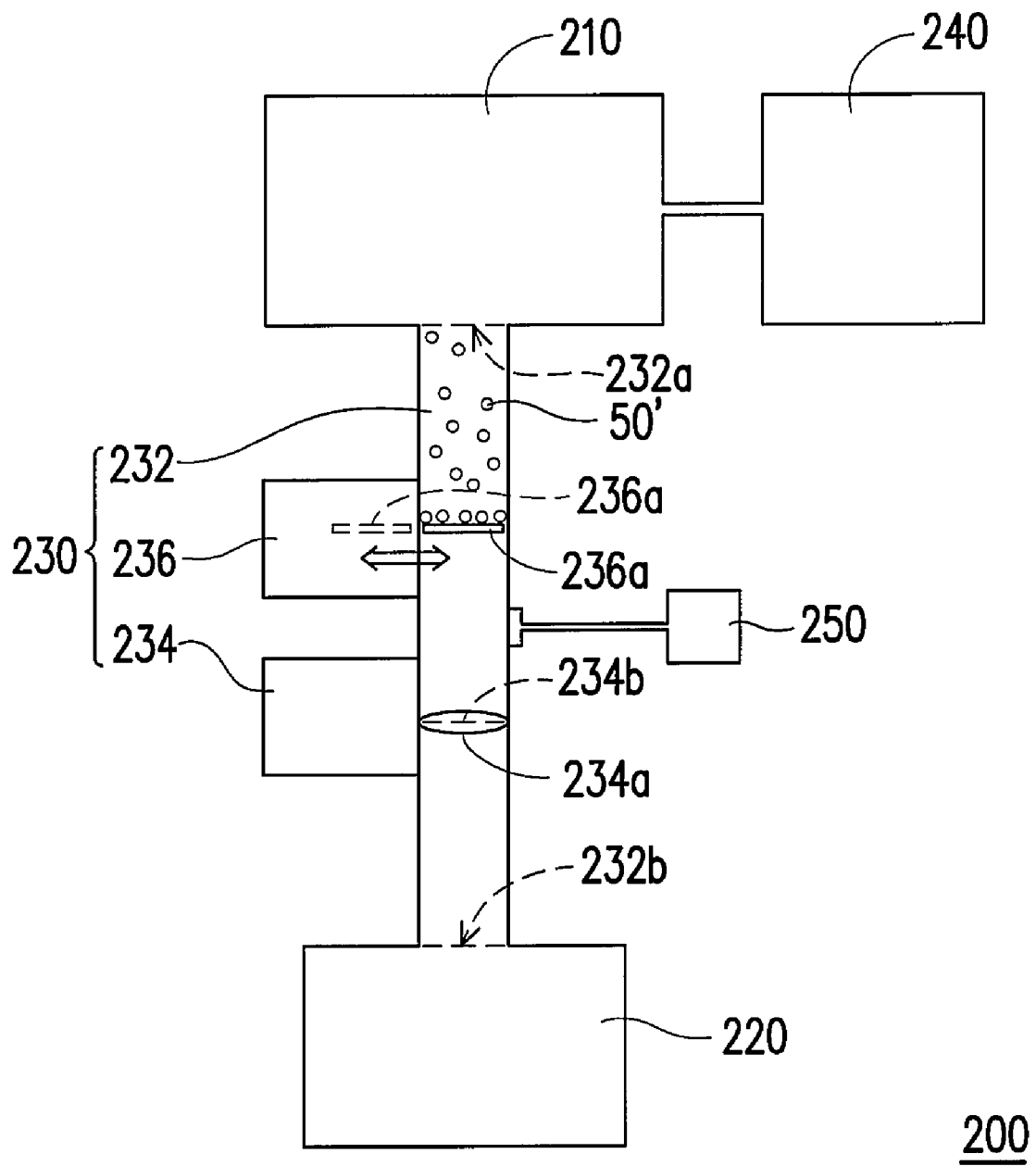
FIG. 2 is a schematic view of a process apparatus according to one embodiment of the present invention.

FIG. 2 is a schematic view of a process apparatus according to one embodiment of the present invention. Referring to FIG. 2, the process apparatus 200 of the present invention includes a chamber 210, a pump 220, and a transportation system 230. The transportation system 230 is set between the chamber 210 and the pump 220. In addition, the transportation system 230 includes a pipe 232, a pressure control valve 234, and a shielding unit 236. The pipe 232 has an input end 232a connected to the chamber 210 and an output end 232b connected to the pump 220. The pump 220 is adapted to pump fluids out of the chamber 210 so as to adjust the pressure therein. In more details, the pump 220 is adapted to pump the fluids out of the chamber 210 through the pipe 232 so as to adjust the pressure therein to a proper level.

Moreover, the pressure control valve 234 is disposed on the pipe 232 and is positioned between the input end 232a and the output end 232b. The pressure control valve 234 comprises a valve plate 234a adapted to adjust a fluid flow in the pipe 232. Specifically, the fluid flow in the pipe 232 is adjusted by modifying an open degree of the valve plate 234a according to the present embodiment. The fluid flow in the pipe 232 increases when the open degree of the valve plate 234a is raised and decreases when said open degree of the valve plate 234a is lowered. The pressure control valve 234 may be a butterfly valve or a pendulum valve, and the butterfly valve is exemplified in the present embodiment. The pressure control valve 234 comprises a pivot shaft 234b connected to the valve plate 234a, so as to rotate the same along the pivot shaft 234b. Thereby, the open degree of the valve plate 234a varies.

Furthermore, the shielding unit 236 is disposed on the pipe 232 and is positioned between the input end 232a and the pressure control valve 234. Said shielding unit 236 comprises a shielding plate 236a adapted to be switched between an original position (where the shielding plate 236a is located, as is depicted in dotted lines in FIG. 2) and a shielding position (where the shielding plate 236a is located, as is depicted in solid lines in FIG. 2). According to the present embodiment, the shielding plate 236a of the shielding unit 236 may perform a movement similar to that of a valve plate of a pendulum valve.

According to the present embodiment, the process apparatus 200 further comprises a fluid supply apparatus 240 connected to the chamber 210 so as to supply the fluids thereto. According to the present embodiment, the fluid supply apparatus 240 supplies reactive fluids e.g. TESO, 4MS, TMCTS, TMDSO, DMDMOS, OMCTS, DEMS, or TVTMCTS, but should not be limited as such. The reactive fluids are, for example, aerosols.

Figure 3:
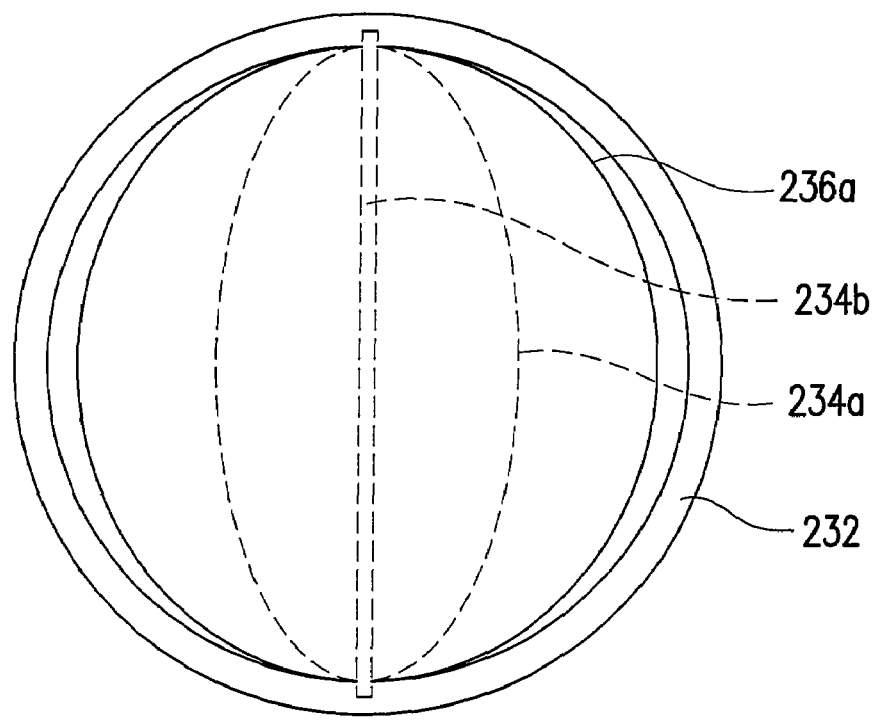
FIG. 3 is a schematic view of a pipe from an input end to an output end during a reaction in a chamber.

FIG. 3 is a schematic view of a pipe from an input end to an output end during a reaction in a chamber. Please refer to FIGS. 2 and 3 together. In the present embodiment, to reduce the probability of adhesion of liquid particles to the valve plate 234a of the pressure control valve 234 during the reaction in the chamber 210, the shielding plate 236a is switched from the original position to the shielding position, so as to prevent certain liquid particles 50' of the fluids floating in the pipe 232.

In addition, to ensure the shielding plate 236a can effectively shield the liquid particles 50', a projection created by the shielding plate 236a on the valve plate 234a along the central line of the pipe 232 substantially covers the whole valve plate 234a when the shielding plate 236a is located at the shielding position. According to the embodiment taking the butterfly valve as an exemplary pressure control valve 234, a projection created by the shielding plate 236a on the pivot shaft 234b along the central line of the pipe 232 substantially covers the whole pivot shaft 234b. Thereby, the shielding plate 236a can effectively reduce the probability of adhesion of the liquid particles 50' to the pivot shaft 234b.

It should be noted that the shielding plate 236a at the shielding position does not completely shield the fluid flow in the pipe 232. Hence, conveyance of the fluids in the pipe 232 is permitted, and thereby the pump 220 is capable of pumping the fluids out of the chamber 210 through the pipe 232 and of adjusting the pressure within the chamber 210 by the pressure control valve 234. Besides, the shielding plate 236a is switched from the shielding position to the original position after the reaction is performed in the chamber 210, and the open degree of the valve plate 234a then reaches a maximum value.

According to the present embodiment, most of the liquid particles 50' are prevented from adhering to the valve plate 234a by the shielding plate 236a during the reaction of the chamber 210. Hence, the problems of the conventional valve plate in that the valve plate cannot rotate smoothly or be completely closed due to adhesion of the liquid particles are resolved. In consequence, the pressure within the chamber 210 can be adjusted to a proper level with ease, and the reaction in the chamber 210 can then be performed under adequate circumstances. In addition, since the shielding plate 236a shields most of the liquid particles 50', it is more unlikely for the pressure control valve 234 to advance the scheduled procedure of maintenance in virtue of its unsmooth operation. Therefore, the maintenance cycle of the process apparatus 200 is not shortened due to filth cumulated on the pressure control valve 234, and the maintenance costs can then be reduced.

Note that the fluids are shielded by the shielding plate 236a when the shielding plate 236a is switched from the original position to the shielding position. In order to keep the pressure in the chamber 210 steady, the open degree of the valve plate 234a may be raised. In other words, the open degree of the valve plate 234a when the shielding plate 236a is located at the shielding position is greater than that of the valve plate 234a when the shielding plate 236a is located at the original position. Moreover, according to one embodiment, a distance between the shielding plate 236a and the valve plate 234a is, for example, less than 50 cm when the shielding plate 236a is located at the shielding position.

The aforementioned transportation system 200 may further comprise a cleaning unit 250 disposed on the pipe 232. The cleaning unit 250 may spray a cleaning solution to the valve plate 234a in the pipe 232 to clean the valve plate 234a. Thereby, the problems of the conventional valve plate in that the valve plate cannot rotate smoothly or be completely closed due to adhesion of the liquid particles do not occur early. Since the transportation system 200 comprises the cleaning unit 250, it is more unlikely for the pressure control valve 234 to advance the scheduled procedure of maintenance in virtue of its unsmooth operation. Therefore, the maintenance cycle of the process apparatus 200 is not shortened due to filth cumulated on the pressure control valve 234, and the maintenance costs can then be reduced.

Figure 4:
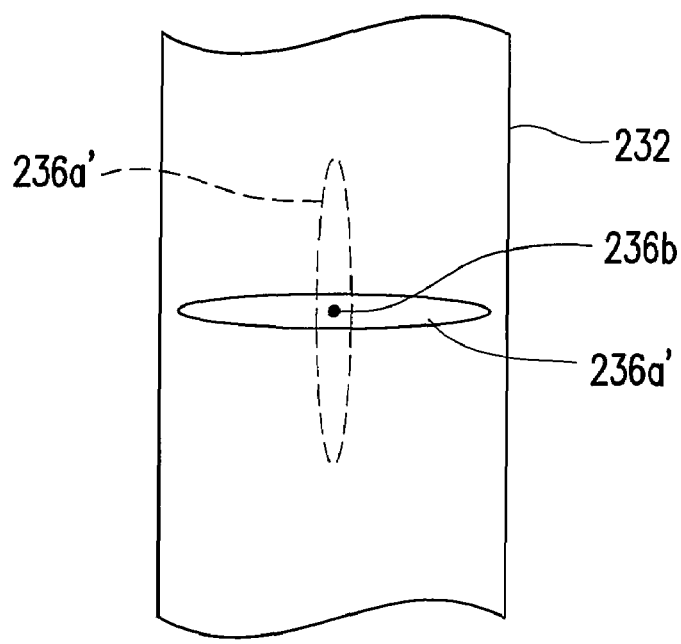
FIG. 4 is a schematic view of a shielding plate of a shielding unit according to another embodiment of the present invention.

It should be noted that the shielding plate 236a of the shielding unit 236 may perform a movement similar to either the movement of a valve plate of a pendulum valve, as is shown in FIG. 2, or that of a valve plate of a butterfly valve. Please refer to FIG. 4 which is a schematic view of a shielding plate of a shielding unit according to another embodiment of the present invention. The shielding plate 236a' similar to a valve plate of a butterfly valve is disposed in the pipe 232 and is adapted to rotate along the pivot shaft 236b. During the reaction in the chamber 210, the shielding plate 236a' rotates from the original position (where the shielding plate 236a' is located, as is depicted in dotted lines in FIG. 4) to the shielding position (where the shielding plate 236a is located, as is depicted in solid lines in FIG. 4). On the contrary, after the reaction is performed in the chamber 210, the shielding plate 236a' rotates from the shielding position to the original position.

In summary, the present invention has at least the following advantages.

1. In the present invention, during the reaction in the chamber, the shielding plate is switched from the original position to the shielding position. Hence, certain liquid particles of the fluid floating in the pipe can be shielded, so as to reduce the probability of adhesion of liquid particles to the valve plate. In consequence, the present invention is capable of improving the conventional valve plate by resolving the problems in that the valve plate 134a cannot rotate smoothly or be completely closed.

2. In the present invention, since most of the liquid particles are shielded by the shielding plate and do not adhere to the valve plate of the pressure control valve, it is more unlikely for the pressure control valve to advance the scheduled procedure of maintenance in virtue of its unsmooth operation. Therefore, the maintenance cycle of the process apparatus is not shortened due to filth cumulated on the pressure control valve, and the maintenance costs can then be reduced 3. In the present invention, since the valve plate of the pressure control valve is cleaned by the cleaning unit, it is more unlikely for the pressure control valve to advance the scheduled procedure of maintenance in virtue of its unsmooth operation. Therefore, the maintenance cycle of the process apparatus is not shortened due to filth cumulated on the pressure control valve, and the maintenance costs can then be reduced It will be apparent to persons of ordinary skill in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A process apparatus, comprising:
    a chamber;
    a pump; and
    a transportation system set between the chamber and the pump, comprising:
        a pipe including an input end and an output end, wherein the input end is connected to the chamber, the output end is connected to the pump, and the pump is adapted to pump fluids out of the chamber through the pipe;
        a pressure control valve disposed on the pipe and positioned between the input end and the output end, wherein the pressure control valve comprises a valve plate adapted to adjust a fluid flow in the pipe; and
        a shielding unit disposed on the pipe and positioned between the input end and the pressure control valve, wherein the shielding unit comprises a shielding plate adapted to be switched between an original position and a shielding position, and the shielding plate permits conveyance of the fluids in the pipe and partially prevents liquid particles of the fluids floating in the pipe when the shielding plate is located at the shielding position.

2. The process apparatus as claimed in claim 1, wherein a projection created by the shielding plate on the valve plate along the central line of the pipe substantially covers the whole valve plate when the shielding plate is located at the shielding position.

3. The process apparatus as claimed in claim 1, wherein a distance between the shielding plate and the valve plate is less than 50 cm when the shielding plate is located at the shielding position.

4. The process apparatus as claimed in claim 1, wherein the pressure control valve is a butterfly valve.

5. The process apparatus as claimed in claim 4, wherein the pressure control valve comprises a pivot shaft connected to the valve plate, and a projection created by the shielding plate on the pivot shaft along the central line of the pipe substantially covers the whole pivot shaft when the shielding plate is located at the shielding position.

6. The process apparatus as claimed in claim 1, wherein the pressure control valve is a pendulum valve.

7. The process apparatus as claimed in claim 1, wherein an open degree of the valve plate when the shielding plate is located at the shielding position is greater than that of the valve plate when the shielding plate is located at the original position.

8. The process apparatus as claimed in claim 1, wherein the transportation system further comprises:
    a cleaning unit disposed on the pipe and adapted to spray a cleaning solution to the valve plate in the pipe.

9. The process apparatus as claimed in claim 1, further comprising:
    a fluid supply apparatus connected to the chamber to supply the fluids thereto.

10. A transportation system adapted to be set between a chamber and a pump, comprising:
    a pipe comprising an input end and an output end, wherein the input end is adapted to connect the chamber, the output end is adapted to connect the pump, and the pump is adapted to pump fluids out of the chamber through the pipe;
    a pressure control valve disposed on the pipe and positioned between the input end and the output end, wherein the pressure control valve comprises a valve plate adapted to adjust a fluid flow in the pipe; and
    a shielding unit disposed on the pipe and positioned between the input end and the pressure control valve, wherein the shielding unit comprises a shielding plate adapted to be switched between an original position and a shielding position, and the shielding plate permits conveyance of the fluids in the pipe and partially prevents liquid particles of the fluids floating in the pipe when the shielding plate is located at the shielding position.

11. The transportation system as claimed in claim 10, wherein a projection created by the shielding plate on the valve plate along the central line of the pipe substantially covers the whole valve plate when the shielding plate is located at the shielding position.

12. The transportation system as claimed in claim 10, wherein a distance between the shielding plate and the valve plate is less than 50 cm when the shielding plate is located at the shielding position.

13. The transportation system as claimed in claim 10, wherein the pressure control valve is a butterfly valve.

14. The transportation system as claimed in claim 13, wherein the pressure control valve comprises a pivot shaft connected to the valve plate, and a projection created by the shielding plate on the pivot shaft along the central line of the pipe substantially covers the whole pivot shaft when the shielding plate is located at the shielding position.

15. The transportation system as claimed in claim 10, wherein the pressure control valve is a pendulum valve.

16. The transportation system as claimed in claim 10, wherein an open degree of the valve plate when the shielding plate is located at the shielding position is greater than that of the valve plate when the shielding plate is located at the original position.

17. The transportation system as claimed in claim 10, further comprising:
    a cleaning unit disposed on the pipe and adapted to spray a cleaning solution to the valve plate in the pipe.

18. A transportation system comprising:
    a pipe comprising an input end and an output end and allowing fluids to be pumped therethrough from the input end to the output end;

a pressure control valve disposed on the pipe and positioned between the input end and the output end, wherein the pressure control valve is adapted to adjust a fluid flow in the pipe; and a shielding unit disposed on the pipe and positioned between the input end and the pressure control valve, wherein the shielding unit comprises a shielding element adapted to be switched between an original position and a shielding position, and the fluid flow in the pipe is shielded partially at the location of the shielding unit when the shielding element is switched to the shielding position.

19. The transportation system as claimed in claim 18, wherein the shielding element is a shielding plate.

* * * * *